United States Patent
Son et al.

(10) Patent No.: US 11,714,512 B2
(45) Date of Patent: Aug. 1, 2023

(54) TOUCH SENSOR MODULE, WINDOW STACK STRUCTURE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Dong Jin Son, Chungcheongnam-do (KR); Beom Cheol Kim, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 81 days.

(21) Appl. No.: 16/939,247

(22) Filed: Jul. 27, 2020

(65) Prior Publication Data
US 2021/0048919 A1    Feb. 18, 2021

(51) Int. Cl.
*G06F 3/041* (2006.01)
*H05K 1/02* (2006.01)
*G06F 3/044* (2006.01)
*H05K 1/18* (2006.01)

(52) U.S. Cl.
CPC .......... *G06F 3/0443* (2019.05); *G06F 3/0412* (2013.01); *H05K 1/028* (2013.01); *H05K 1/189* (2013.01)

(58) Field of Classification Search
CPC ..... G06F 3/0443; G06F 3/0412; H05K 1/028; H05K 1/189
See application file for complete search history.

(56) References Cited

U.S. PATENT DOCUMENTS

2018/0253170 A1* 9/2018 Noh ..................... G06F 3/0443
2019/0019855 A1* 1/2019 Park ..................... G02F 1/13338
2020/0089347 A1* 3/2020 Baek ..................... G06F 3/0446

FOREIGN PATENT DOCUMENTS

CN    109521911 A  *  3/2019  ........... G06F 3/0412
KR    20200048669 A  *  5/2020  ............ G06F 3/041

OTHER PUBLICATIONS

KR20200048669A.Eng Google.pdf Google machine English translation of Korean patent publication KR20200048669A.Kr Application Filed Oct. 30, 2018; published May 8, 2020.*

* cited by examiner

*Primary Examiner* — Stephen G Sherman
(74) *Attorney, Agent, or Firm* — The PL Law Group, PLLC

(57) ABSTRACT

A touch sensor module according to an embodiment of the present invention includes a touch sensor layer including a visual area, a bending area and a pad area, a flexible circuit board electrically connected to the touch sensor layer on the pad area of the touch sensor layer, supporting structure covering the touch sensor layer on the bending area, and an optical layer disposed on the visual area of the touch sensor layer. The optical layer partially covers the supporting structure on a portion of the bending area adjacent to the visual area.

13 Claims, 6 Drawing Sheets

TOUCH SENSOR MODULE, WINDOW STACK STRUCTURE INCLUDING THE SAME AND IMAGE DISPLAY DEVICE INCLUDING THE SAME

CROSS-REFERENCE TO RELATED APPLICATION AND CLAIM OF PRIORITY

This application claims priority to Korean Patent Applications No. 10-2019-0100065 filed on Aug. 16, 2019 in the Korean Intellectual Property Office (KIPO), the entire disclosure of which is incorporated by reference herein.

BACKGROUND

1. Field

The present invention relates to a touch sensor module, a window stack structure including the same and an image display device including the same. More particularly, the present invention related to a touch sensor module including a sensing electrode and an insulation structure, a window stack structure including the same and an image display device including the same.

2. Description of the Related Art

As information technologies are being developed, various demands in display devices having thinner dimension, light-weight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

As a flexible display capable of being bent or folded is being developed, the touch sensor having proper properties, structures and constructions for being applied to the flexible display is also needed. Additionally, a proper locational and structural design of the touch sensor may be required in consideration of a connection reliability with a main board, a circuit board, etc., in the image display device.

SUMMARY

According to an aspect of the present invention, there is provided a touch sensor module having improved electrical and mechanical reliability.

According to an aspect of the present invention, there is provided a window stack structure including a touch sensor module having improved electrical and mechanical reliability.

According to an aspect of the present invention, there is provided an image display device including a touch sensor module having improved electrical and mechanical reliability.

The above aspects of the present invention will be achieved by one or more of the following features or constructions:

(1) A touch sensor module, comprising: a touch sensor layer including a visual area, a bending area and a pad area; a flexible circuit board electrically connected to the touch sensor layer on the pad area of the touch sensor layer; a supporting structure covering the touch sensor layer on the bending area; and an optical layer disposed on the visual area of the touch sensor layer, the optical layer partially covering the supporting structure on a portion of the bending area adjacent to the visual area.

(2) The touch sensor module according to the above (1), wherein the touch sensor layer includes: sensing electrodes arranged on the visual area; and traces branched from the sensing electrodes to extend to the bending area and the pad area.

(3) The touch sensor module according to the above (2), wherein end portions of the traces are electrically connected to the flexible circuit board on the pad area.

(4) The touch sensor module according to the above (1), wherein the supporting structure includes a substrate layer and a supporting layer formed on the substrate layer, and the supporting layer includes an adhesive material.

(5) The touch sensor module according to the above (4), wherein the supporting structure extends to the pad area to partially cover the flexible circuit board.

(6) The touch sensor module according to the above (1), further comprising an adhesive layer formed on a bottom surface of a portion of the touch sensor layer in the visual area.

(7) The touch sensor module according to the above (6), further comprising a lower supporting structure formed on the bottom surface of a portion of the touch sensor layer in the bending area.

(8) The touch sensor module according to the above (7), wherein the lower supporting structure includes a lower substrate layer and a lower supporting layer formed on the lower substrate layer and combined with the bottom surface of the touch sensor layer, and the lower supporting layer includes an adhesive material.

(9) The touch sensor module according to the above (8), wherein the lower substrate layer has a modulus greater than that of the lower supporting layer.

(10) The touch sensor module according to the above (1), wherein the flexible circuit board includes a core layer, an upper wiring formed on a top surface of the core layer, and a lower wiring formed on a bottom surface of the core layer.

(11) The touch sensor module according to the above (10), wherein the core layer of the flexible circuit board extends to the bending area, and a portion of the core layer in the bending area is provided as the supporting structure.

(12) The touch sensor module according to the above (11), further comprising a conductive intermediate structure interposed between the flexible circuit board and the touch sensor layer.

(13) The touch sensor module according to the above (12), wherein the conductive intermediate structure extends on the bending area and the pad area, and the conductive intermediate structure is interposed between the supporting structure and the touch sensor layer on the bending area.

(14) The touch sensor module according to the above (1), wherein the optical layer includes at least one selected from a group consisting of a polarizing plate, a polarizer, a retardation film, a reflective sheet, a luminance enhancing film and a refractive index matching film.

(15) A window stack structure, comprising: a window substrate; and the touch sensor module according to exemplary embodiments above as described above on a surface of the window substrate.

(16) An image display device, comprising: a display panel; and the touch sensor module according to exemplary embodiments above as described above on the display panel.

(17) The image display device according to the above (16), further comprising a main board under the display panel, wherein the touch sensor layer and the flexible circuit board of the touch sensor module are bent at the bending area together with the supporting structure to be electrically connected to the main board.

A touch sensor module according to embodiments of the present invention may include a supporting structure partially covering a touch sensor layer and a flexible printed circuit board. When the touch sensor module is folded or bent, delamination of the flexible printed circuit board may be prevented by the supporting structure and damages to sensing electrodes or traces in a bending area may be also prevented.

In some embodiments, the touch sensor module may further include an optical film disposed on the touch sensor layer. The optical film may cover, e.g., an end portion of the supporting structure in the bending area. Accordingly, when a bending stress is applied, the supporting structure may be prevented from being lifted and detached by the optical film.

In some embodiments, an adhesive layer may be selectively formed only under a portion of the touch sensor layer in a visual area to maintain flexibility in the bending area, and an additional structure such as a display panel may be combined in the visual area.

The touch sensor module may be fabricated as a substrate-less type thin film and may be effectively applied to an image display device such as a flexible display.

DETAILED DESCRIPTION OF THE EMBODIMENTS

According to exemplary embodiments of the present invention, there is provided a touch sensor module including a touch sensor layer, an optical layer, a flexible circuit board and an adhesive structure and having improved mechanical and electrical stability.

According to exemplary embodiments of the present invention, a window stack structure and an image display device including the touch sensor module is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, for example, two directions being parallel to a top surface of a touch sensor layer and perpendicular to each other are defined as a first direction and a second direction. For example, the first direction may correspond to a length direction of the touch sensor module, and the second direction may correspond to a width direction of the touch sensor module. Additionally, a direction vertical to the first and second directions may be defined as a third direction. For example, the third direction may correspond to a thickness direction of the touch sensor module.

Figure 1:
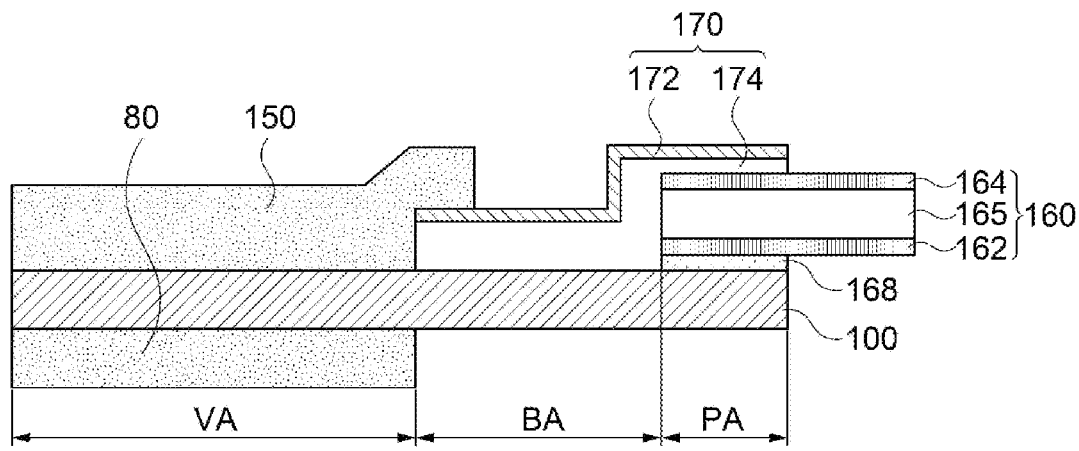
FIG. 1 is a schematic cross-sectional view illustrating a touch sensor module in accordance with exemplary embodiments.

FIG. 1 is a schematic cross-sectional view illustrating a touch sensor module in accordance with exemplary embodiments.

Referring to FIG. 1, the touch sensor module may include a touch sensor layer 100, an optical layer 150 disposed on the touch sensor layer 100, and a flexible circuit board 160. The touch sensor module may also include a supporting structure 170 partially covering the flexible circuit board 160 and the touch sensor layer 100.

The touch sensor layer 100 may include, e.g., a base insulation layer and sensing electrodes and traces formed on the base insulation layer. Elements and constructions of the touch sensor layer 100 will be described in more detail with reference to FIGS. 2 and 3.

The touch sensor layer 100 or the touch sensor module may include a visual area VA, a bending area BA and a pad area PA. The visual area VA may include a central area of the touch sensor layer 100, and the pad area PA may be positioned at one end portion of the touch sensor layer 100. The bending area BA may be positioned between the visual area VA and the pad area PA.

The visual area VA may include, e.g., a display area of an image display device or an active area where a user's touch may be sensed.

A flexible printed circuit board (FPCB) 160 may be disposed on a portion of the touch sensor layer 100 in the pad area PA, and may be electrically connected to the traces included in the touch sensor layer 100. In an embodiment, a pad portion formed at an end portion of the trace and a circuit wiring included in the flexible circuit board 160 may be electrically connected to each other by a conductive intermediate structure 168 such as an anisotropic conductive film (ACF).

The flexible circuit board 160 may include, e.g., a core layer 165 including a resin or a liquid crystal polymer, and the circuit wiring printed on the core layer 165. The circuit wiring may include an upper wiring 164 and a lower wiring 162 formed on upper and lower surfaces of the core layer 165, respectively. The flexible circuit board 160 may further include an upper coverlay film and a lower coverlay film covering the upper wiring 164 and the lower wiring 162, respectively.

For example, a portion of the lower coverlay film may be removed to expose a portion of the lower wiring 162 that may be bonded to the conductive intermediate structure 168.

The touch sensor layer 100 may further include a passivation layer that may protect the sensing electrode and the traces. In this case, a portion of the passivation layer formed in the pad area PA connected to the flexible circuit board 160 may be removed.

The supporting structure 170 may be formed or attached to the flexible circuit board 160 on the pad area PA, and may extend to the bending area BA to partially cover the touch sensor layer 100. Accordingly, the supporting structure 170 may commonly and partially cover end portions of the touch sensor layer 100 and the flexible circuit board 160.

In some embodiments, the supporting structure 170 may substantially entirely cover the bending area BA.

The supporting structure 170 may serve as a protective pattern to prevent damages such as delamination, cracks, etc., of the sensing electrodes and the traces caused when the flexible circuit board 160 is detached, folded or bent by an external stress in the bending area BA.

The supporting structure 170 may have a multi-layered structure. For example, the supporting structure 170 may include a substrate layer 172 and a supporting layer 174 formed on a surface of the substrate layer 172. The supporting layer 174 may include, e.g., an acrylic, silicone, urethane, and/or rubber-based adhesive material, and may hold the flexible circuit board 160 and the touch sensor layer 100 commonly in the bending area BA and the pad area PA.

The substrate layer 172 may include a polymer material having a modulus or an elasticity greater than that of the supporting layer 174. For example, the substrate layer 172 may include a polymer film including cyclic olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), polyurethane (PU), cellulose acetate propionate (CAP), polyethersulfone (PES), cellulose triacetate (TAC), polycarbonate (PC), cyclic olefin copolymer (COC), polymethyl methacrylate (PMMA), etc.

For example, the supporting structure 170 may have a tape form including the supporting layer 174 formed by applying the adhesive material on the substrate layer 172.

The touch sensor module may further include the optical layer 150. The optical layer 150 may include a film or a layer structure widely known in the related art for improving an image visibility of an image display device. Non-limiting examples of the optical layer 150 may include a polarizing plate, a polarizer, a retardation film, a reflective sheet, a luminance enhancing film, a refractive index matching film, etc. These may be used alone or in a multi-layered structure.

In exemplary embodiments, the optical layer 150 may be located at substantially the same layer or the same level as that of the supporting structure 170, and may cover the visual area VA of the touch sensor layer 100.

In exemplary embodiments, an end portion of the optical layer 150 may extend over the supporting structure 170 formed in the bending area BA. Accordingly, end portions of the optical layer 150 and the supporting structure 170 may overlap each other.

The optical layer 150 may partially extend to the bending area BA to hold the end portion of the supporting structure 170 so that the end portion of the supporting structure 170 may be prevented from being lifted or peeled-off when the touch sensor layer 100 is bent.

In some embodiments, an adhesive layer for combining the optical layer 150 may be further formed on a top surface of the touch sensor layer 100 at the visual layer VA.

An adhesive layer 80 may be formed on a bottom surface of the touch sensor layer 100 in the visual area VA. In exemplary embodiments, the adhesive layer 80 may be formed in the visual area VA, and may not extend to the bending area BA. Accordingly, an additional structure such as a display panel may be combined in the visual area VA while promoting a bending operation in the bending area BA.

Figure 2:
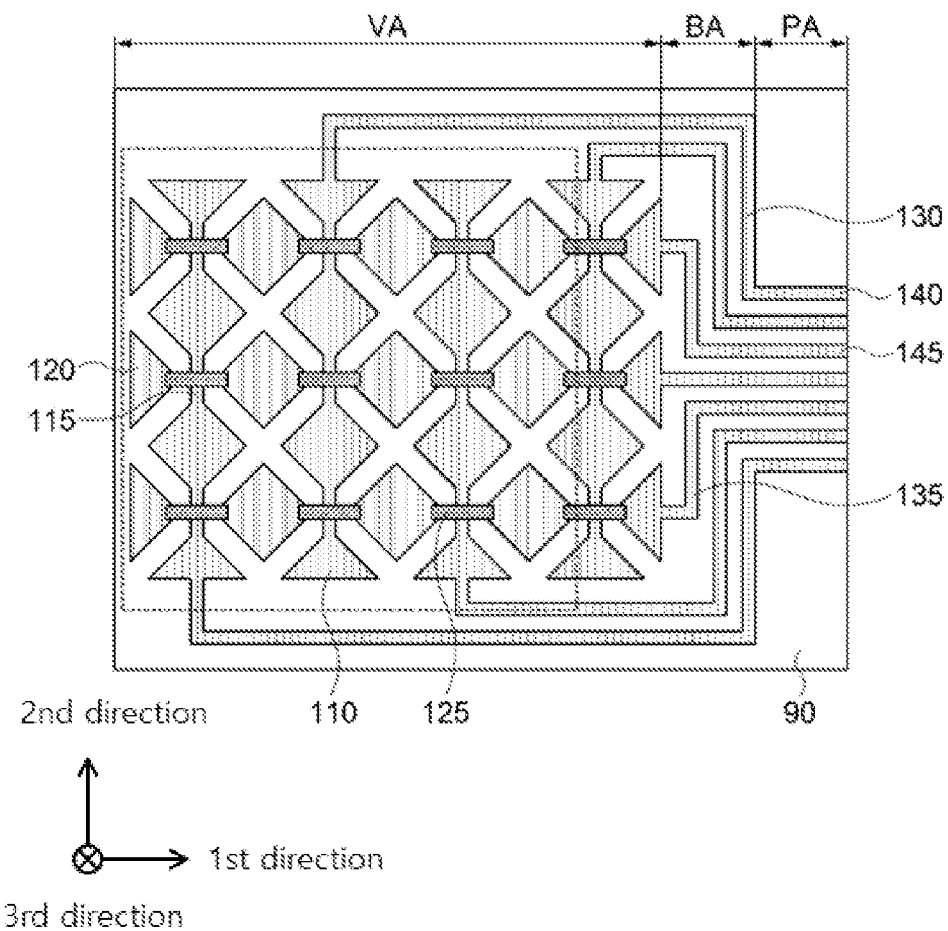
FIGS. 2 and 3 are schematic top planar views illustrating touch sensor layers in accordance with exemplary embodiments.
Figure 3:
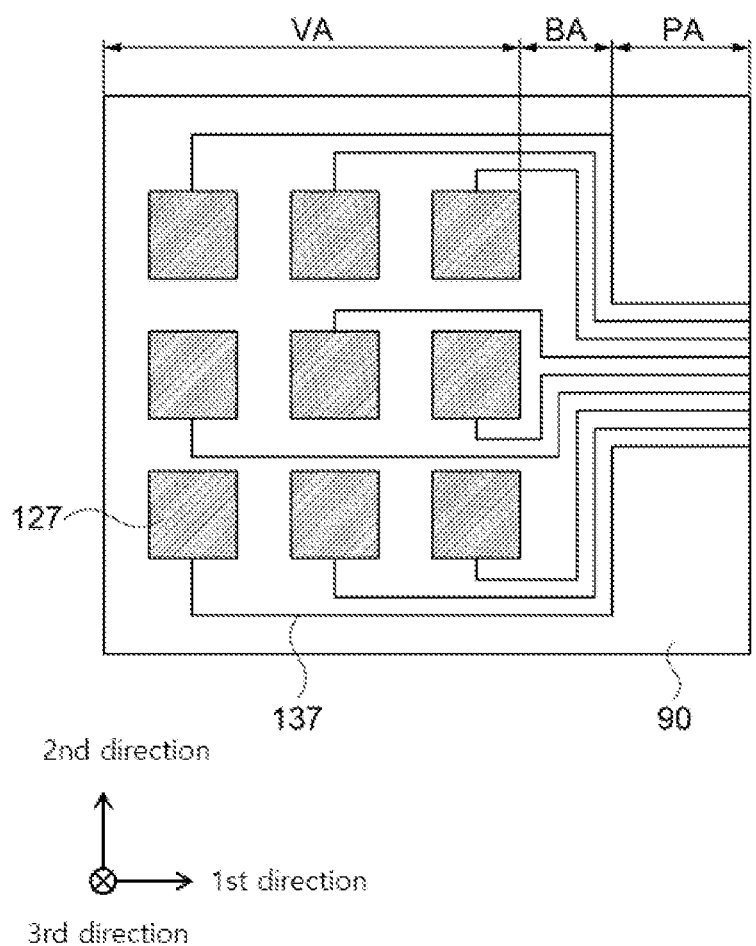

FIGS. 2 and 3 are schematic top planar views illustrating touch sensor layers in accordance with exemplary embodiments.

Referring to FIG. 2, the touch sensor layer 100 may include a base insulation layer 90, and sensing electrodes 110 and 120 and traces 130 and 135 arranged on the base insulation layer 90. In exemplary embodiments, the sensing electrodes 110 and 120 may be arranged to be operable by a mutual capacitance-type. The base insulation layer 90 may serve as a base layer or a supporting layer for forming the sensing electrodes 110 and 120 and the traces 130 and 135.

The sensing electrodes 110 and 120 may be arranged in the visual area VA of the touch sensor layer 100. In exemplary embodiments, the sensing electrodes 110 and 120 may include first sensing electrodes 110 and second sensing electrodes 120.

The first sensing electrodes 110 may be arranged, e.g., along the second direction (e.g., a width direction). Accordingly, a first sensing electrode row extending in the second direction may be formed by a plurality of the first sensing electrodes 110. A plurality of the first sensing electrode rows may be arranged along the first direction.

In some embodiments, the first sensing electrodes 110 neighboring in the second direction may be physically or electrically connected to each other by a connecting portion 115. For example, the connecting portion 115 may be integrally formed with the first sensing electrodes 110 at the same level as that of the first sensing electrodes 110.

The second sensing electrodes 120 may be arranged along the first direction (e.g., a length direction). In some embodiments, the second sensing electrodes 120 may each be physically separated into unit electrodes of an island type. In this case, the second sensing electrodes 120 neighboring in the first direction may be electrically connected to each other by a bridge electrode 125.

A plurality of the second sensing electrodes 120 may be connected to each other by the bridge electrodes 125 and may be arranged in the first direction such that a second sensing electrode column extending in the first direction may be formed. Further, a plurality of the second sensing electrode rows may be arranged along the second direction.

The sensing electrodes 110 and 120 and/or the bridge electrode 125 may include a metal, an alloy or a transparent conductive oxide.

For example, the sensing electrodes 110 and 120 and/or the bridge electrode 125 may be formed of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), tin (Sn), zinc (Zn), molybdenum (Mo), calcium (Ca), or an alloy thereof (e.g., a silver-palladium-copper (APC) alloy or a copper-calcium (CuCa) alloy). These may be used alone or in a combination thereof.

The sensing electrodes 110 and 120 and/or the bridge electrode 125 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 110 and 120 and/or the bridge electrode 125 may have a multi-layered structure including a transparent conductive oxide layer and a metal layer. For example, the sensing electrodes 110 and 120 and/or the bridge electrode 125 may have a triple-layered structure of a transparent conductive oxide layer-metal layer-transparent conductive oxide layer. In this case, flexible properties may be improved and resistance may be reduced by the metal layer while corrosion resistance and transparency may be improved by the transparent conductive oxide layer.

In some embodiments, the bridge electrode 125 may be formed on an insulation layer (not illustrated). The insulation layer may at least partially cover the connecting portion 115 included in the first sensing electrode 110, and at least partially cover the second sensing electrodes 120 around the connecting portion 115. The bridge electrode 125 may penetrate through the insulation layer and may be electrically connected to the second sensing electrodes 120 adjacent to each other with the connecting portion 115 interposed therebetween.

The insulation layer may include an inorganic insulation material such as a silicon oxide or a silicon nitride, or an organic insulation material such as an acrylic resin or a siloxane resin.

The traces 130 and 135 may include a first trace 130 extending from each of the first sensing electrode rows and a second trace 135 extending from each of the second sensing electrode columns.

As illustrated in FIG. 2, the traces 130 and 135 may extend from a periphery of the visual area VA and be collected in the pad area PA via the bending area BA.

For example, the first trace 130 may be branched from each of the first sensing electrode rows from both lateral portions of the touch sensor layer 100 and may extend in the first direction. The first traces 130 may be bent while entering the bending area BA to extend in the second direction. The first traces 130 may be bent again in the first direction to extend in the first direction in the pad area PA.

In some embodiments, the first traces 130 may be alternately distributed on both lateral portions of the touch sensor layer. The first traces 130 may be evenly distributed on both lateral portions of the touch sensor layer so that stress generated during the bending operation as described below may be uniformly dispersed. Additionally, the first traces 130 may be alternately arranged on the both lateral portions so that an alignment margin between the neighboring first traces 130 may be increased.

The second traces 135 may each be branched from each second sensing electrode row and may extend in the second direction in the bending area BA. The second traces 135 may be bent again in the first direction to extend in the first direction to the pad area PA.

End portions of the traces 130 and 135 may serve as pad portions that may be collected in the pad area PA and electrically connected to the flexible circuit board 160. A first pad portion 140 and a second pad portion 145 may be defined by end portions of the first trace 130 and the second trace 135, respectively, and may be disposed in the pad area PA.

The traces 130 and 135 may include a conductive material substantially the same as or similar to that of the sensing electrodes 110 and 120.

In exemplary embodiments, the flexible circuit board 160 may be electrically connected to the pad portions 140 and 145 on the pad area PA. In some embodiments, the conductive intermediate structure 168 such as an anisotropic conductive film (ACF) may be disposed between the flexible circuit board 160 and the pad portions 140 and 145.

As described with reference to FIG. 1, the supporting structure 170 may commonly cover the bending area BA and the pad area PA in a planar view. An adhesion between the flexible circuit board 160 and the touch sensor layer 100 may be enhanced by the supporting structure 170, so that mechanical failures such as detachment or cracks of the flexible circuit board 160 and/or the traces 130 and 135 may be prevented.

As described above, the optical layer 150 may cover the visual area VA, and may extend to the bending area BA to cover an end portion of the supporting structure 170. Thus, the end portion of the supporting structure 170 may be prevented from being lifted or peeled-off when being bent.

Referring to FIG. 3, sensing electrodes 127 and traces 137 of the touch sensor layer may be arranged to be operable in a self-capacitance type.

The touch sensor layer may include the sensing electrodes 127 each of which may be provided in an independent island pattern. Additionally, the traces 137 may be branched from each sensing electrode 127 to extend to the pad area PA. End portions of the traces 137 may be collected in the pad area PA and may be electrically connected to the flexible circuit board 160.

As described above, the supporting structure 170 may commonly cover the touch sensor layer 100 and the flexible circuit board 160 on the pad area PA and the bending area BA. Additionally, the optical layer 150 and the supporting structure 170 may overlap on a portion of the bending area BA adjacent to the visual area VA.

FIGS. 4 to 7 are schematic cross-sectional view illustrating touch sensor modules in accordance with some exemplary embodiments. Detailed descriptions on elements and/or structures substantially the same as or similar to those as described with reference to FIG. 1 are be omitted herein.

Figure 4:
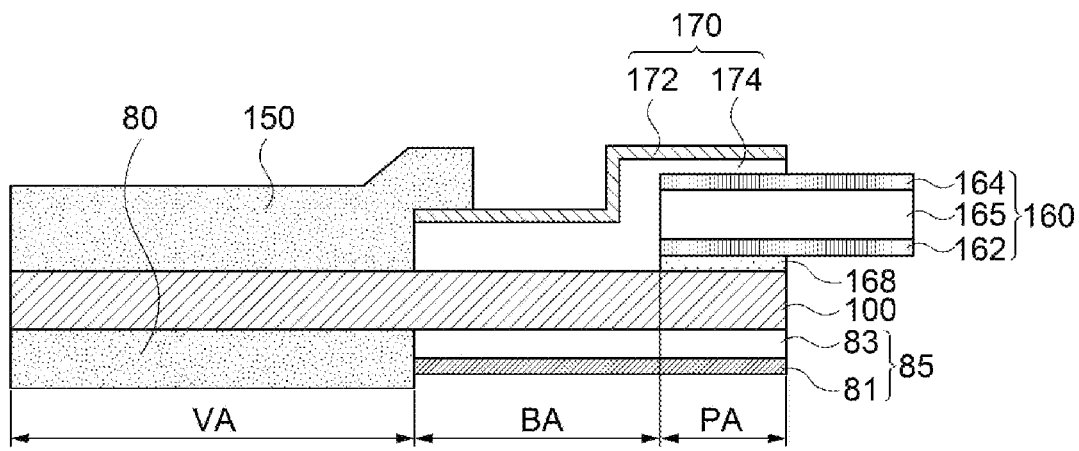
FIGS. 4 to 7 are schematic cross-sectional view illustrating touch sensor modules in accordance with some exemplary embodiments.

Referring to FIG. 4, a lower supporting structure 85 may be combined with a bottom surface of a portion of the touch sensor layer 100 in the bending area BA and the pad area PA.

In some embodiments, the lower supporting structure 85 may have elements and structures substantially the same or similar to those of the supporting structure 170. For example, the lower supporting structure 85 may include a lower substrate layer 81 and a lower supporting layer 83 including an adhesive material, and the lower supporting layer 83 may be attached to the bottom surface of the touch sensor layer 100.

The adhesive layer 80 may be formed on the bottom surface of the touch sensor layer 100 in the visual area VA, and the lower supporting layer 85 may be formed on the bottom surface of the bending area BA. Thus, bending stability may be enhanced by the lower supporting layer 85 having improved modulus and an additional structure such as a display panel may be combined by the adhesive layer 80.

Figure 5:
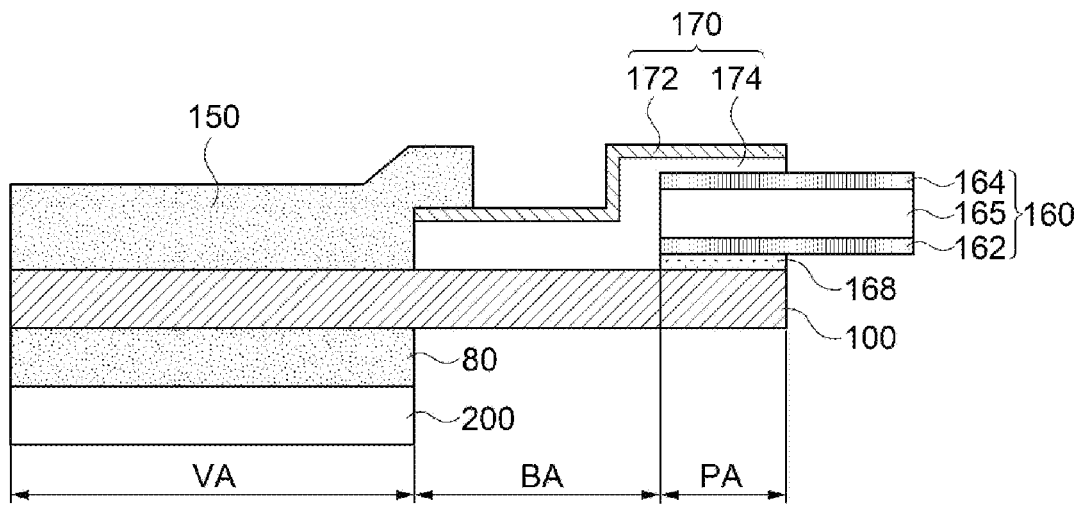

Referring to FIG. 5, the touch sensor module may be combined with a display panel 200 using the adhesive layer 80 in the visual area VA.

In some embodiments, as described with reference to FIG. 4, the lower supporting structure 85 may be formed under the touch sensor layer 100 of the bending area BA and the pad area PA.

Figure 6:
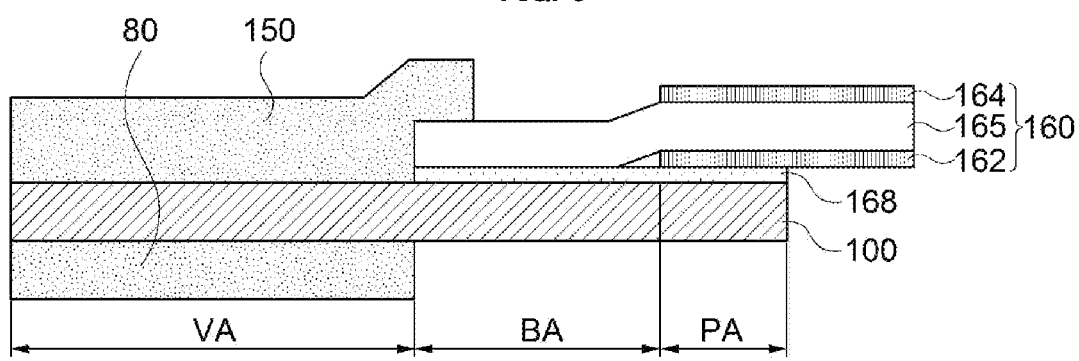

Referring to FIG. 6, a portion of the flexible circuit board 160 may substantially serve as a supporting structure.

In exemplary embodiments, the core layer 165 included in the flexible circuit board 160 may selectively extend to the bending area BA to serve as the supporting structure protecting the touch sensor layer 100.

In some embodiments, the conductive intermediate structure 168 (e.g., ACF) disposed under the flexible circuit board 160 may also extend to the bending area BA to be interposed between the touch sensor layer 100 and the core layer 165. Accordingly, the core layer 165 may be stably attached to the bending area BA by the conductive intermediate structure 168, and the traces 130 and 135 in the bending area BA may be protected.

In a portion of the bending area BA adjacent to the visual area VA, the optical layer 150 may cover an end portion of the core layer 165.

As described above, the core layer 165 of the flexible circuit board 160 and the conductive intermediate structure 168 may extend to the bending area BA, so that the traces may be further protected and supported substantially without an additional structure.

Figure 7:
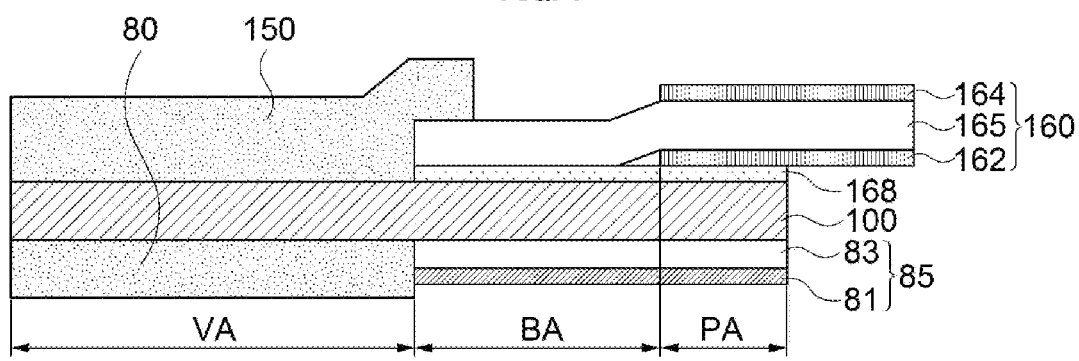

Referring to FIG. 7, as described with reference to FIG. 4, the lower supporting structure 85 may be combined with the bottom surface of the touch sensor layer 100 in the bending area BA and the pad area PA. The lower supporting structure 85 may include the lower substrate layer 81 and the lower supporting layer 83 including an adhesive material, and the lower supporting layer 83 may be attached to the bottom surface of the touch sensor layer 100.

Accordingly, supporting effects may be provided by the core layer 165 of the flexible circuit board 160 at an upper portion of the touch sensor layer 100, and bending stability may be provided by the lower supporting structure 85 at a lower portion of the touch sensor layer 100.

As described with reference to FIG. 5, the display panel 200 may be combined using the adhesive layer 80.

Figure 8:
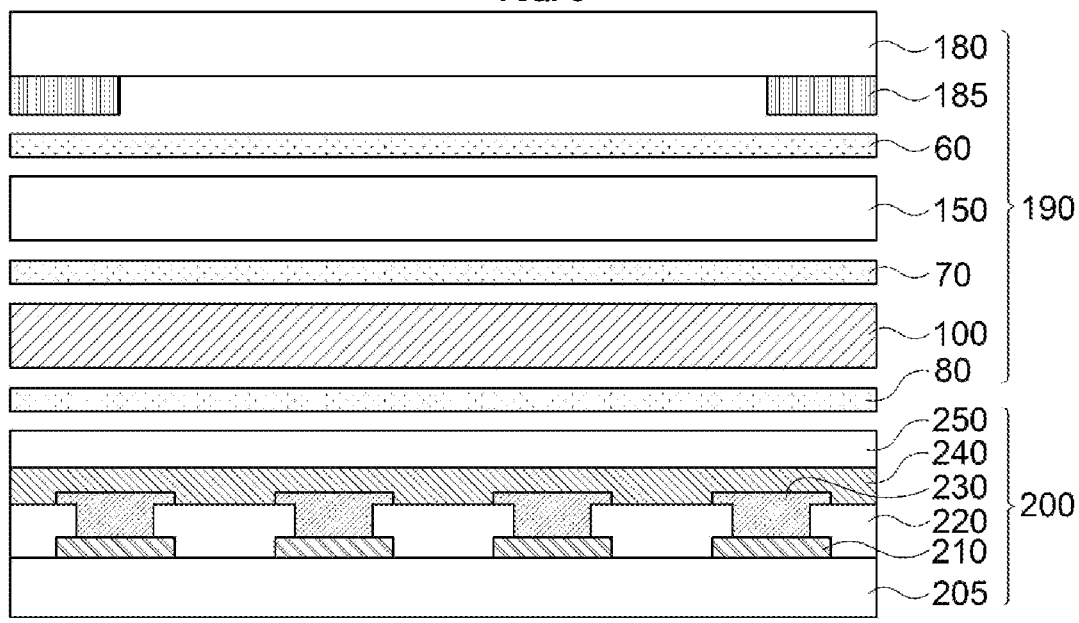
FIG. 8 is a schematic view illustrating a window stack structure and an image display device in accordance with exemplary embodiments.

FIG. 8 is a schematic view illustrating a window stack structure and an image display device in accordance with exemplary embodiments.

Referring to FIG. 8, a window stack structure 190 may include a window substrate 180 and a touch sensor module according to exemplary embodiments described above. The touch sensor module may include, e.g., the touch sensor layer 100 and the optical layer 150 stacked on the visual area VA of the touch sensor layer 100 as described with reference to FIGS. 2 and 3. For convenience of descriptions, illustration of the supporting structure 170 and the flexible circuit board 160 are omitted in FIG. 8 and will be described in more detail with reference to FIG. 9.

The window substrate 180 may include, e.g., a hard coating film or a thin or ultra-thin glass (e.g., ultra-thin glass (UTG)). In an embodiment, a light-shielding pattern 185 may be formed on a peripheral portion of one surface of the window substrate 180. The light-shielding pattern 185 may include, e.g., a color-printed pattern, and may have a single-layered or multi-layered structure. A bezel portion or a non-display area of the image display device may be defined by the light-shielding pattern 185.

The optical layer 150 may include various optical films or optical structures included in the image display device. In some embodiments, the optical layer 150 may include a coating-type polarizer or a polarizing plate. The coating-type polarizer may include a liquid crystal coating layer that may include a cross-linkable liquid crystal compound and a dichroic dye. In this case, the optical layer 150 may include an alignment layer for providing an orientation of the liquid crystal coating layer.

For example, the polarizing plate may include a polyvinyl alcohol-based polarizer and a protective film attached to at least one surface of the polyvinyl alcohol-based polarizer.

The optical layer 150 may be directly attached to the surface of the window substrate 180 or may be attached via a first adhesive layer 60.

The touch sensor layer 100 may be included in the window stack structure 190 as a film or a panel. In an embodiment, the touch sensor layer 100 may be combined with the optical layer 150 via a second adhesive layer 70.

As illustrated in FIG. 8, the window substrate 180, the optical layer 150 and the touch sensor layer 100 may be sequentially positioned from a viewer's side. In this case, sensing electrodes of the touch sensor layer 100 may be disposed under the optical layer 150 including the polarizer or the polarizing plate so that electrode patterns may be effectively prevented from being seen by the viewer.

The image display device may include a display panel 200 and the window stack structure 190 disposed on the display panel. The window stack structure 190 may include the touch sensor module according to exemplary embodiments.

The display panel 200 may include a pixel electrode 210, a pixel defining layer 220, a display layer 230, an opposing electrode 240 and an encapsulation layer 250 disposed on a panel substrate 205.

The panel substrate 205 may include a flexible resin material. In this case, the image display device may be a flexible display.

A pixel circuit including a thin film transistor (TFT) may be formed on the panel substrate 205, and insulation layer covering the pixel circuit may be formed. The pixel electrode 210 may be electrically connected to, e.g., a drain electrode of the TFT on the insulation layer.

The pixel defining layer 220 may be formed on the insulation layer, and the pixel electrode 210 may be exposed through the pixel defining layer 220 such that a pixel region may be defined. The display layer 230 may be formed on the pixel electrode 210, and the display layer 230 may include, e.g., a liquid crystal layer or an organic light emitting layer.

The opposing electrode 240 may be disposed on the pixel defining layer 220 and the display layer 230. The opposing electrode 240 may serve as, e.g., a common electrode or a cathode of the image display device. The encapsulation layer 250 may be disposed on the opposing electrode 240 to protect the display panel 200.

As described with reference to FIG. 5, the display panel 200 may be combined with the touch sensor layer 100 through an adhesive layer 80. For example, a thickness of the adhesive layer 80 may be greater than each thickness of the first and second adhesive layers 60 and 70. A viscoelasticity of the adhesive layer 80 may be about 0.2 MPa or less at a temperature ranging from −20° C. to 80° C. In this case, a noise from the display panel 200 may be blocked, and an interface stress while being bent may be alleviated so that damages of the window stack structure 190 may be avoided. In an embodiment, the viscoelasticity of the adhesive layer 80 may be in a range from about 0.01 MPa to about 0.15 MPa.

Figure 9:
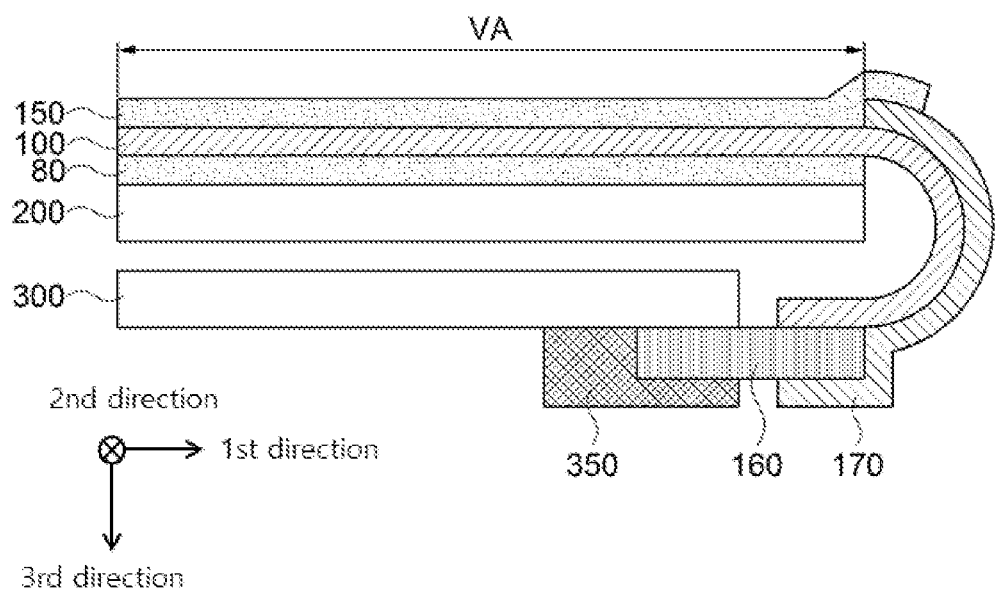
FIG. 9 is a schematic cross-sectional view illustrating an image display device combined with a touch sensor module in accordance with exemplary embodiments.

FIG. 9 is a schematic cross-sectional view illustrating an image display device combined with a touch sensor module in accordance with exemplary embodiments. For example, FIG. 9 illustrates an driving circuit connection of a touch sensor module via a flexible circuit board.

Referring to FIG. 9, the image display device includes the display panel 200 and a main board 300, and may include a touch sensor module according to exemplary embodiments as described above. The touch sensor module may include the touch sensor layer 100 and the optical layer 150 disposed on the visual area VA of the touch sensor layer 100.

As described with reference to FIG. 1, bending may be initiated from the bending area BA of the touch sensor layer 100 and the bending may occur in the third direction (e.g., a thickness direction of the image display device) along the first direction. Accordingly, pad portions of the traces included in the pad area PA may be electrically connected to the main board 300 via the flexible circuit board 160. The flexible circuit board 160 may be connected to, e.g., a bonding pad 350 formed on a bottom surface of the main board 300.

In an embodiment, an end portion (e.g., the pad area PA and/or the bending area BA) of the touch sensor module or the touch sensor layer 100 may be bent by 180 degrees)(° or more. Accordingly, the end portion may extend again in the first direction. The end portion may face an non-bent portion of touch sensor layer 100 portion in the third direction.

As described above, even though drastic bending is applied, the supporting structure 170 may fix a combination between the flexible circuit board 160 and the touch sensor layer 100, thereby suppressing fracture, separation, etc. of circuits, wiring, electrodes, etc. Additionally, the optical layer 150 may cover and hold an end portion of the supporting structure 170 so that detachment of the supporting structure 170 in a bending initiation area may be prevented.

For example, in the touch sensor module according to exemplary embodiments, cracks of the traces may be prevented even in a bending radius of 0.2 R or more. Preferably, mechanical and operational reliability of the traces may be maintained even in a bending radius of 1 R or more.

What is claimed is:

1. A touch sensor module, comprising:
    a touch sensor layer including a visual area, a pad area positioning at one end portion of the touch sensor layer, and a bending area in which the touch sensor layer is bent or in which touch sensor layer is configured to be bent, the bending area positioning between the visual area and the pad area;
    a flexible circuit board electrically connected to the touch sensor layer on the pad area of the touch sensor layer;
    a supporting structure covering the touch sensor layer on the bending area and extending to the pad area to partially cover the flexible circuit board;
    an optical layer disposed on the visual area of the touch sensor layer, the optical layer partially covering the supporting structure on a portion of the bending area adjacent to the visual area; and
    a lower supporting structure formed on a bottom surface of a portion of the touch sensor layer in the bending area,
    wherein the supporting structure directly contacts a top surface of the touch sensor layer and a top surface of the flexible circuit board,
    wherein the lower supporting structure comprises a lower substrate layer, and a lower supporting layer formed on the lower substrate layer and combined with the bottom surface of the touch sensor layer, and the lower supporting layer comprises an adhesive material.

2. The touch sensor module according to claim 1, wherein the touch sensor layer comprises:
    sensing electrodes arranged on the visual area; and
    traces branched from the sensing electrodes to extend to the bending area and the pad area.

3. The touch sensor module according to claim 2, wherein end portions of the traces are electrically connected to the flexible circuit board on the pad area.

4. The touch sensor module according to claim 1, wherein the supporting structure comprises a substrate layer and a supporting layer formed on the substrate layer, and the supporting layer comprises an adhesive material.

5. The touch sensor module according to claim 1, further comprising an adhesive layer formed on the bottom surface of a portion of the touch sensor layer in the visual area.

6. The touch sensor module according to claim 1, wherein the lower substrate layer has a modulus greater than that of the lower supporting layer.

7. The touch sensor module according to claim 1, wherein the flexible circuit board comprises a core layer, an upper wiring formed on a top surface of the core layer, and a lower wiring formed on a bottom surface of the core layer.

8. The touch sensor module according to claim 1, wherein the optical layer includes at least one selected from the group consisting of a polarizing plate, a polarizer, a retardation film, a reflective sheet, a luminance enhancing film and a refractive index matching film.

9. A window stack structure, comprising:
    a window substrate; and
    the touch sensor module according to claim 1 on a surface of the window substrate.

10. An image display device, comprising:
    a display panel; and
    the touch sensor module according to claim 1 on the display panel.

11. The image display device according to claim 10, further comprising a main board under the display panel,
    wherein the touch sensor layer and the flexible circuit board of the touch sensor module are bent at the bending area together with the supporting structure to be electrically connected to the main board.

12. The touch sensor module according to claim 1, wherein the touch sensor layer is bent in the bending area.

13. The touch sensor module according to claim 1, wherein the touch sensor layer is configured to be bent in the bending area.

* * * * *